(12) United States Patent
Chen et al.

(10) Patent No.: US 8,427,840 B2
(45) Date of Patent: Apr. 23, 2013

(54) MULTI-CHIP MODULE

(75) Inventors: Kuo-Chiang Chen, Taipei County (TW); Arthur Shaoyan Rong, Taipei (TW); Chen Hsing Liu, Taoyuan County (TW); Yen-Yi Chen, Taipei County (TW)

(73) Assignee: Fortune Semiconductor Corporation, Taipei Hsien (TW)

( * ) Notice: Subject to any disclaimer, the term of this patent is extended or adjusted under 35 U.S.C. 154(b) by 334 days.

(21) Appl. No.: 12/951,381

(22) Filed: Nov. 22, 2010

(65) Prior Publication Data

US 2012/0127671 A1    May 24, 2012

(51) Int. Cl.
*H05K 7/02* (2006.01)
*H05K 7/06* (2006.01)
*H05K 7/08* (2006.01)
*H05K 7/10* (2006.01)

(52) U.S. Cl.
USPC ............................ 361/783; 361/782; 361/784

(58) Field of Classification Search .......... 361/760–763, 361/782–784, 813
See application file for complete search history.

(56) References Cited

U.S. PATENT DOCUMENTS 6,912,134 B2 * 6/2005 Grant et al. .................... 361/760
7,262,950 B2 * 8/2007 Suzuki et al. ................. 361/139

* cited by examiner

*Primary Examiner* — Tuan T Dinh
(74) *Attorney, Agent, or Firm* — Rosenberg, Klein & Lee

(57) ABSTRACT

A multi-chip module is disclosed to include a pin frame, an electric power switch chip, and a battery protection chip. The pin frame has a chip placement region and six pins. The second pin and the fifth pin are electrically connected at the chip placement region, and the other pins are set electrically isolated from each other. A bottom surface of the electric power switch chip is electrically connected at the chip placement region, and a top surface thereof is electrically connected to the first pin and the third pin. A bottom surface of the battery protection chip is disposed at the top surface of the electric power switch chip in an electrically isolated fashion. A top surface of the battery protection chip is electrically connected to the top surface of the electric power switch chip, the first pin, the fourth pin, and the sixth pin.

12 Claims, 9 Drawing Sheets

MULTI-CHIP MODULE

BACKGROUND OF THE DISCLOSURE

1. Technical Field

The present disclosure relates to a multi-chip module, especially to a multi-chip module which may be applicable to small outline transistor 26 (SOT 26) packaging and is embedded with power metal-oxide-semiconductor field-effect transistor (power MOSFET). The multi-chip module may be used as a protection circuit of a single-cell lithium-ion/polymer battery.

2. Description of Related Art

Please refer to FIG. 1. FIG. 1 is a schematic diagram of a conventional singe-cell lithium-ion/polymer battery device 1. The single-cell lithium-ion/polymer battery device 1 has several kinds of protection mechanics. If a single-cell lithium-ion/polymer battery device 1 is overcharged, an intense exothermic reaction may occur within the battery device 1, increasing the potential of the battery device 1 catching fire. The currently commercially available single-cell lithium-ion/polymer battery device 1 is mainly composed of a single-cell lithium-ion/polymer battery cell 10 and a single-cell lithium-ion/polymer battery protection board 12. The single-cell lithium-ion/polymer battery protection board 12 is for preventing the single-cell lithium-ion/polymer battery cell 10 from being overcharged.

The single-cell lithium-ion/polymer battery protection board 12 is mainly composed of resistors R1 and R2, a capacitor C, and a single-cell lithium-ion/polymer battery protection integrated circuit (IC) 120 along with a power metal-oxide-semiconductor field-effect transistor integrated circuit (power MOSFET IC) 122, all of which are welded at a circuit board (not shown). The power MOSFET IC 122 includes two power MOSFETs M1 and M2. By activating the single-cell lithium-ion/polymer battery protection IC 120, the power MOSFET M1 of the power MOSFET IC 122 may prevent current from flowing out of the single-cell lithium-ion/polymer battery cell 10, and the other power MOSFET M2 may prevent current from flowing into the single-cell lithium-ion/polymer battery cell 10. The single-cell lithium-ion/polymer battery protection IC 120 is usually packaged by small outline transistor 26 (SOT 26), and the power MOSFET IC 122 is usually packaged by thin-shrink small outline package 8 (TSSOP8).

In addition, some commercially available single-cell lithium-ion/polymer battery protection IC is embedded with a MOSFET, and such 2-in-1 single-cell lithium-ion/polymer battery protection IC is packaged by TSSOP8 and mini small outline package 8 (MSOP8). However, the size of the single-cell lithium-ion/polymer battery protection IC packaged by TSSOP8 generally takes up a relatively larger space (around 4.35 mm/3.15 mm/0.92 mm), failing to meet the increasing demand of compact size for semiconductor devices.

SUMMARY

Because of the aforementioned problems, the present disclosure provides a multi-chip module packaged by SOT 26 and having a single-cell lithium-ion/polymer battery protection IC embedded with a MOSFET.

In an exemplary embodiment of the present disclosure, the multi-chip module includes a pin frame, an electric power switch chip, and a battery protection chip.

The pin frame includes a chip placement region, a first pin, a second pin, a third pin, a fourth pin, a fifth pin, and a sixth pin. The second pin and the fifth pin are electrically connected to the chip placement region with the first pin, the third pin, the fourth pin, and the sixth pin electrically isolated from each other. A bottom surface of the electric power switch chip is electrically connected at the chip placement region. A top surface of the electric power switch chip is electrically connected to the first pin and the third pin. A bottom surface of the battery protection chip is displaced at a predetermined area of the top surface of the electric power switch chip in an electrically isolated fashion. In another implementation, the battery protection chip may be placed at the chip placement region in an electrically isolated fashion. A top surface of the battery protection chip is electrically connected to the top surface of the electric power switch chip, the first pin, the fourth pin, and the sixth pin.

To sum up, the exemplary embodiment of the multi-chip module of the present disclosure is a single-cell lithium-ion/polymer battery protection IC embedded with the MOSFET and packaged by SOT 26. Consequently, the size of the multi-chip module after packaging may stand at 2.95 mm/1.56 mm/1.11 mm. Therefore, the multi-chip module in the present disclosure occupies lesser space, further helping miniaturize the size of the semiconductor devices.

For further understanding of the disclosure, reference is made to the following detailed description illustrating the embodiments and examples of the disclosure. The description is only for illustrating the disclosure, not for limiting the scope of the claim.

BRIEF DESCRIPTION OF THE DRAWINGS

The drawings included herein provide further understanding of the disclosure. A brief introduction of the drawings is as follows.

DETAILED DESCRIPTION OF THE PREFERRED EMBODIMENTS

Figure 1:
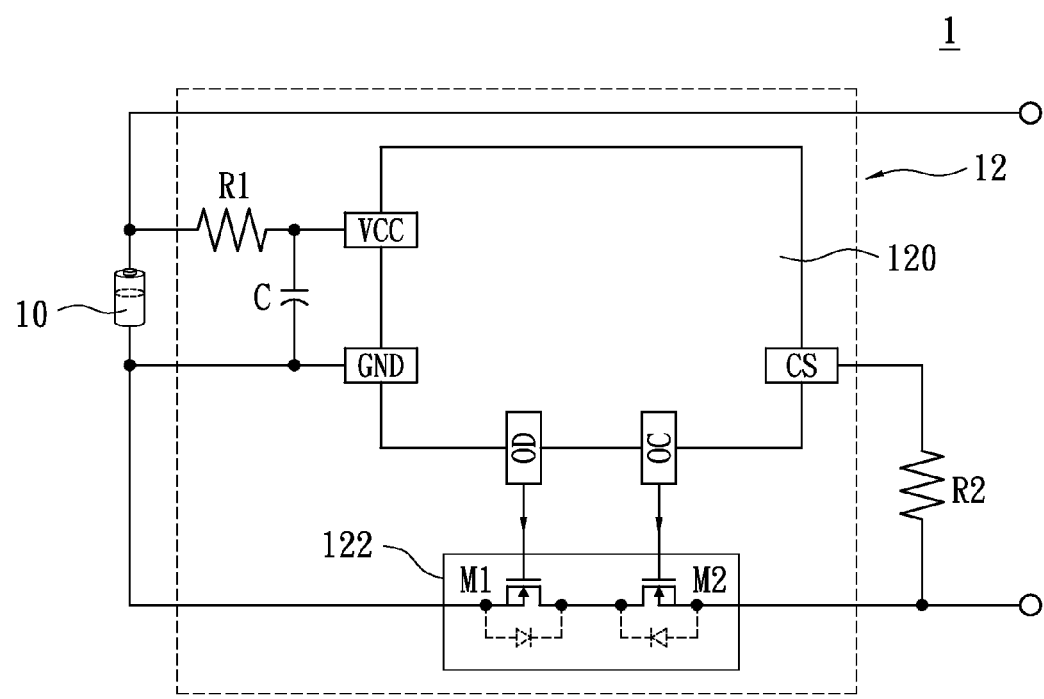
FIG. 1 is a schematic diagram of a conventional single-cell lithium-ion/polymer battery device.
Figure 2A:
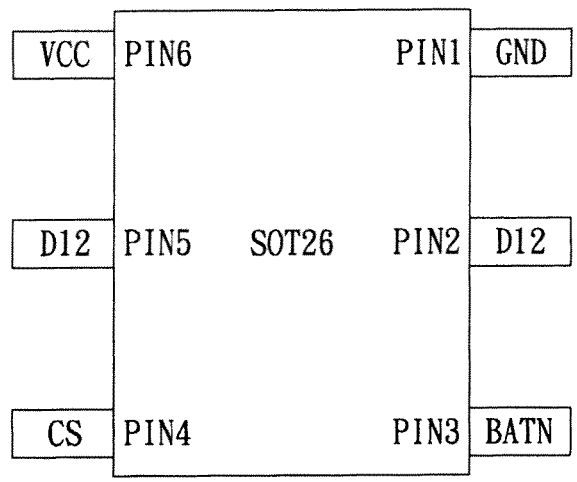
FIG. 2A is a schematic pin configuration diagram of an exemplary embodiment of the multi-chip module according to the present disclosure.

Please refer to FIG. 2A, FIG. 2A is a schematic pin configuration diagram of an exemplary embodiment of a multi-chip module 2 according to the present disclosure. The multi-chip module 2 is packaged by SOT 26, and includes six pins. In this exemplary embodiment, the six pins includes the first pin PIN1, which is a common ground pin (GND), the second pin PIN2 and the fifth pin PIN5, both of which are common drain pins (D12), the third pin PIN3, which is a load pin (BATN), the fourth pin PIN4 that is an over current sensing pin (CS), and the sixth pin PIN6 that is a battery voltage detection pin (VCC).

Figure 2B:
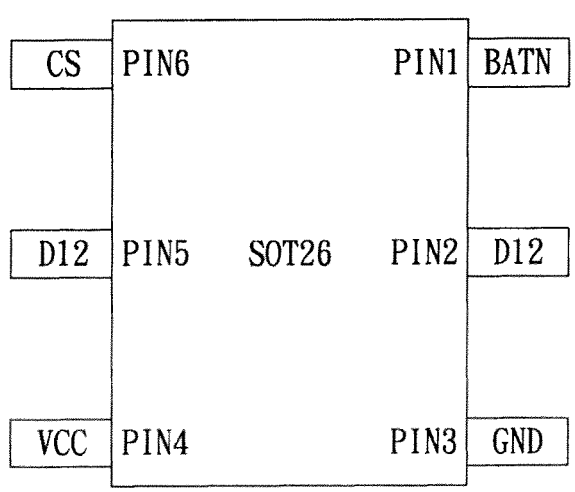
FIG. 2B is a schematic pin configuration diagram of another exemplary embodiment of the multi-chip module according to the present disclosure.

In addition, please refer to FIG. 2B. FIG. 2B is a schematic pin configuration diagram of another exemplary embodiment of the multi-chip module 2 according to the present disclosure. In this exemplary embodiment, the definition of pins of multi-chip module 2 includes the first pin PIN1 (BATN), the second pin PIN2 and the fifth pin PIN5, both of which are D12, the third pin PIN3 (GND), the fourth pin PIN4 (VCC), and the sixth pin PIN6 (CS).

Figure 3:
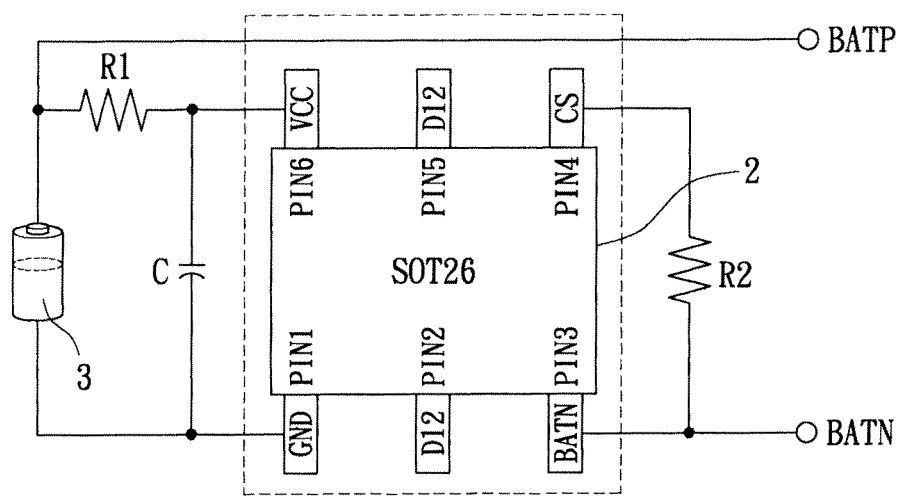
FIG. 3 is a schematic circuit diagram of an exemplary embodiment of the multi-chip module according to the present disclosure.

Please refer to FIG. 3 along with FIG. 2A. FIG. 3 is a schematic circuit diagram of an exemplary embodiment of the multi-chip module 2 according to the present disclosure. In this exemplary embodiment, the multi-chip module 2 may be soldered at a circuit board (not shown) with a single-cell lithium-ion/polymer battery cell 3, resistors R1 and R2, and capacitor C, before a single-cell lithium-ion/polymer battery device could be prepared. As shown in FIG. 3, resistor R2 may be connected between the third pin PIN3 and the fourth pin PIN4 of the multi-chip module 2, for sensing the current. In addition, the resistor R1, the capacitor C, and the single-cell lithium-ion/polymer battery cell 3 may be connected between the first pin PIN1 and the sixth pin PIN6, for obtaining the operation voltage from the single-cell lithium-ion/polymer battery cell 3.

As described above, the size of the multi-chip module 2 which is packaged by SOT 26 may be relatively reduced, freeing up more available spaces of the circuit board and the whole single-cell lithium-ion/polymer battery device.

Figure 4A:
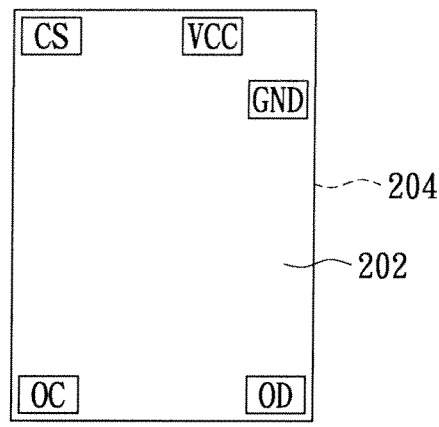
FIG. 4A is a schematic pin configuration diagram of an exemplary embodiment of a battery protection chip according to the present disclosure.
Figure 4B:
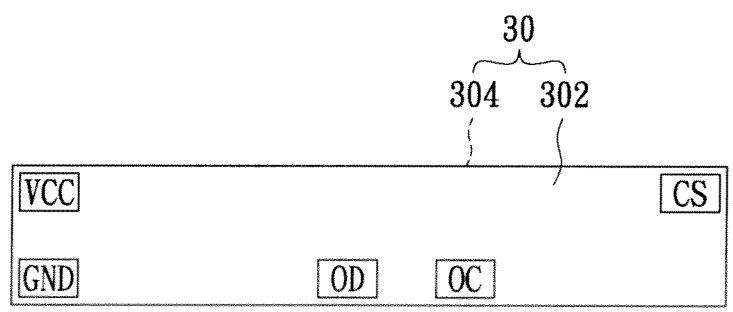
FIG. 4B is a schematic pin configuration diagram of another exemplary embodiment of another battery protection chip according to the present disclosure.

Please refer to FIG. 4A. FIG. 4A is a schematic pin configuration diagram of an exemplary embodiment of a battery protection chip 20 according to the present disclosure. The battery protection chip 20 has a top surface 202 and a bottom surface 204. The top surface 202 includes an over-charging control output shim (OC), an over-discharging control output shim (OD), an operation voltage input shim (VCC), a ground shim (GND), and a current sensing shim (CS). In addition, FIG. 4B is a schematic pin configuration diagram of another exemplary embodiment of another battery protection chip 30 according to the present disclosure. The battery protection chip 30 has a top surface 302 and a bottom surface 304. The top surface 302 includes an over-charging control output shim (OC), an over-discharging control output shim (OD), an operation voltage input shim (VCC), a ground shim (GND), and a current sensing shim (CS).

Figure 5A:
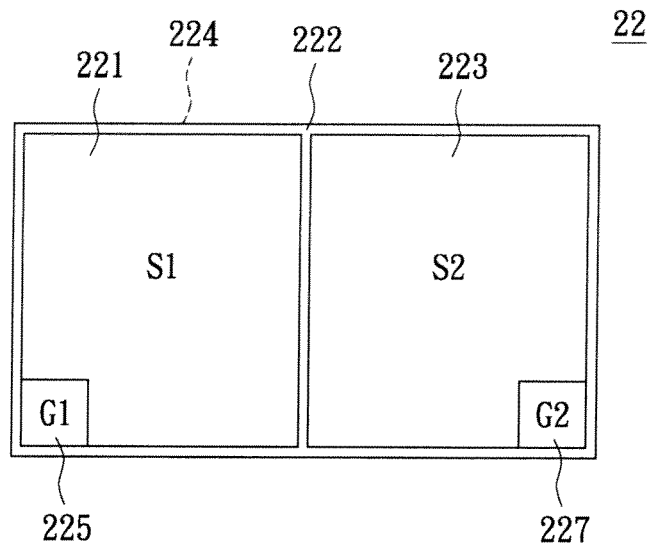
FIG. 5A is a schematic pin configuration diagram of an exemplary embodiment of an electric power switch chip according to the present disclosure.
Figure 5B:
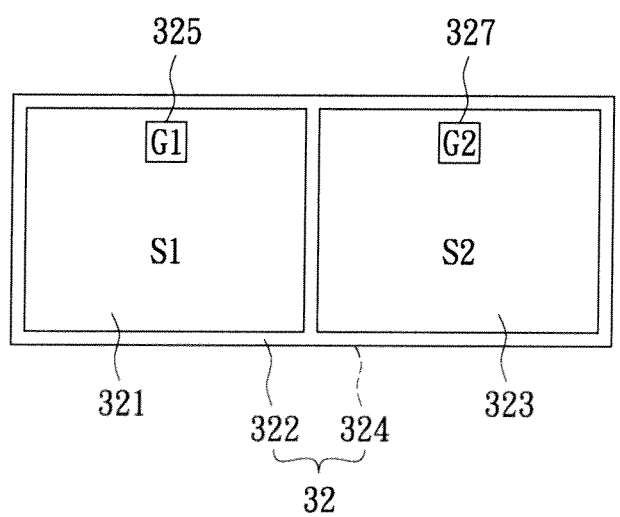
FIG. 5B is a schematic pin configuration diagram of another exemplary embodiment of the electric power switch chip according to the present disclosure.

Please refer to FIG. 5A in which a schematic pin configuration diagram of an exemplary embodiment of an electric power switch chip 22 according to the present disclosure is illustrated. The electric power switch chip 22 has a top surface 222 and a bottom surface 224. The electric power switch chip 22 includes two power metal-oxide-semiconductor field-effect transistors (power MOSFET). A bottom surface 224 of the electric power switch chip 22 is a common drain of the two power MOSFETs. A top surface 222 of the electric power switch chip 22 includes a first source region 221, a first gate region 225, a second source region 223, and a second gate region 227. FIG. 5B is a schematic pin configuration diagram of another electric power switch chip. The electric power switch chip 32 has a top surface 322 and a bottom surface 324. The electric power switch chip 32 also includes two power MOSFETs. A bottom surface 324 of the electric power switch chip 32 is a common drain of the two power MOSFETs. A top surface 322 of the electric power switch chip 32 includes a first source region 321, a first gate region 325, a second source region 323, and a second gate region 327.

Figure 6A:
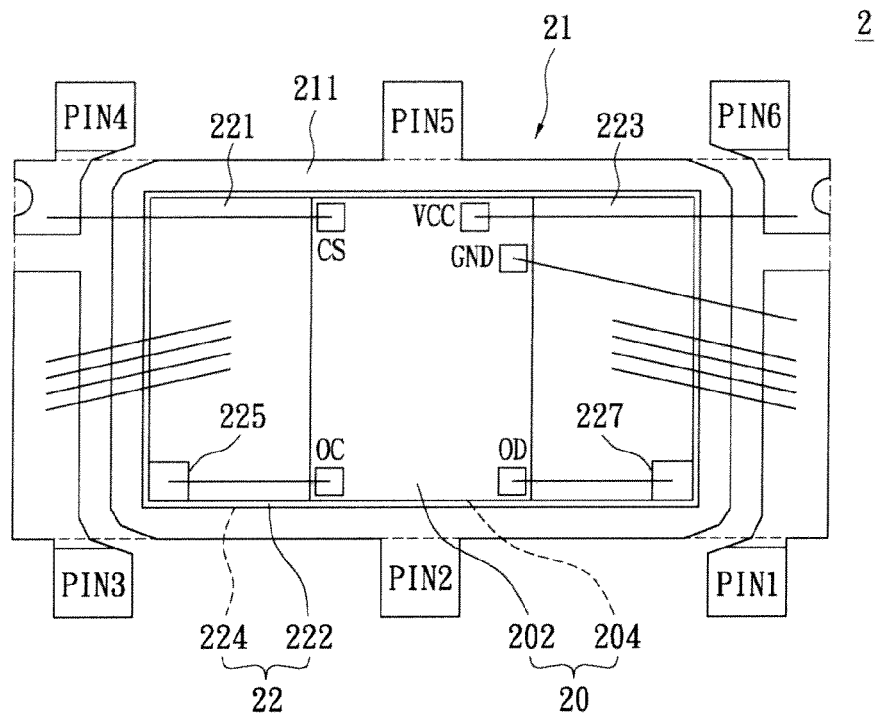
FIG. 6A is a schematic package structure diagram of an exemplary embodiment of the multi-chip module according to the present disclosure.

Please refer to FIG. 6A along with FIGS. 2A, 4A, and 5A. FIG. 6A is a schematic package structure of an exemplary embodiment of the multi-chip module according to the present disclosure. The multi-chip module 2 includes a pin frame 21, an electric power switch chip 22, and a battery protection chip 20. The pin frame 21 has a chip placement region 211, a first pin PIN1, a second pin PIN2, a third pin PIN3, a fourth pin PIN4, a fifth pin PIN5, and a sixth pin PIN6. The second pin PIN2 and the fifth pin PIN5 are electrically connected to the chip placement region 211, and the pins PIN1, PIN3, PIN4, and PIN6 are electrically-isolated from each other.

The bottom surface 224 of the electric power switch chip 22 is electrically connected at the chip placement region 211, and the top surface 222 of the electric power switch chip 22 is electrically connected to the first pin PIN1 and the third pin PIN3. The bottom surface 224 of the electric power switch chip 22 is electrically connected to the chip placement region 211 through a conductive adhesive. Additionally, the first source region 221 at the top surface 222 of the electric power switch chip 22 is electrically connected to the third pin PIN3 through a conductive wire, while the second source region 223 is electrically connected to the first pin PIN1 through another conductive wire.

The bottom surface 204 of the battery protection chip 20 is disposed at a predetermined area of the top surface 222 of the electric power switch chip 22 in an electrically isolated fashion. In addition, the top surface 202 of the battery protection chip 20 is electrically connected to the top surface 222 of the electric power switch chip 22, the first pin PIN1, the fourth pin PIN4, and the sixth pin PIN6. In one implementation, the battery protection chip 20 is disposed at the predetermined area of the top surface 222 of the electric power switch chip 22 by an insulation rubber.

Figure 6B:
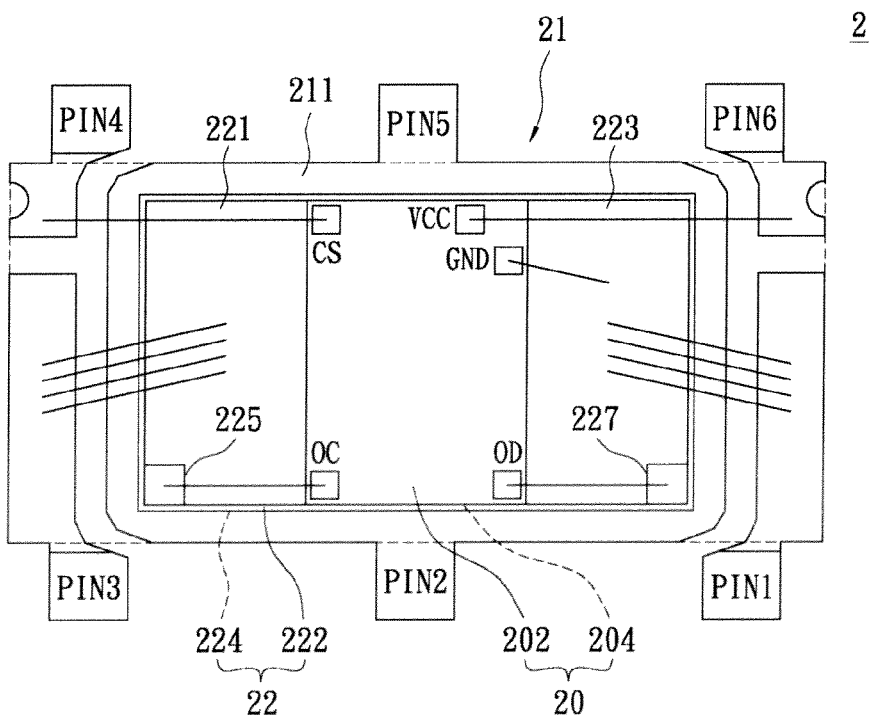
FIG. 6B is a schematic package structure diagram of another exemplary embodiment of the multi-chip module according to the present disclosure.

The over-charging control output shim (OC) which is set at the top surface 202 of the battery protection chip 20 is electrically connected to the first gate region 225 at the top surface 222 of the electric power switch chip 22 through a conductive wire. The over-discharging control output shim (OD) is electrically connected to the second gate region 227 at the top surface 222 of the electric power switch chip 22 through another conductive wire. The operation voltage input shim (VCC) is electrically connected to the sixth pin PIN6 of the pin frame 21 through another conductive wire. The current sensing shim (CS) is electrically connected to the fourth pin PIN4 of the pin frame 21 via another conductive wire. Moreover, the ground shim (GND) may be electrically connected to the first pin PIN1 of the pin frame 21 directly through a conductive wire. In another implementation, the ground shim (GND) may be electrically connected to the first pin PIN1 of the pin frame 21 through the second source region 223 at the top surface 222 of the electric power switch chip 22 (as shown in FIG. 6B).

Figure 7A:
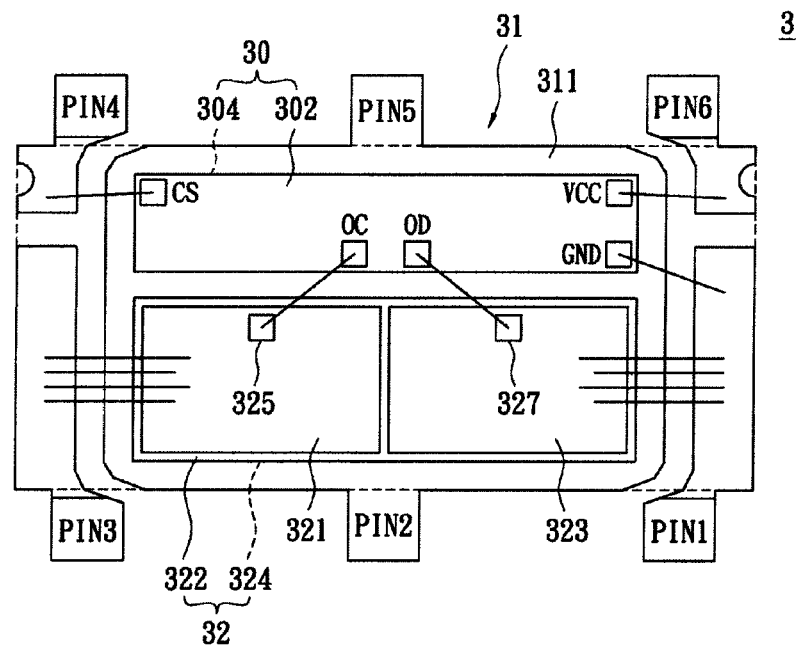
FIG. 7A is a schematic package structure diagram of another exemplary embodiment of the multi-chip module according to the present disclosure.

Please refer to FIG. 7A along with FIG. 6A. FIG. 7A is a package structure diagram of an exemplary embodiment of a multi-chip module 3 according to the present disclosure. The difference between the multi-chip module 3 in FIG. 7A and the multi-chip module 2 in FIG. 6A includes that a battery protection chip 30 and an electric power switch chip 32 of the multi-chip 3 are at a chip placement region 311 of a pin frame 31.

Please refer to FIG. 7A along with FIGS. 2A, 4B, and 5B. A bottom surface 324 of the electric power switch chip 32 is electrically connected at the chip placement region 311. In addition, a first source region 321 and a second source region 323 at the top surface 322 of the electric power switch chip 32 are electrically connected to a third pin PIN3 and a first pin PIN1 of the pin frame 31, respectively.

Figure 7B:
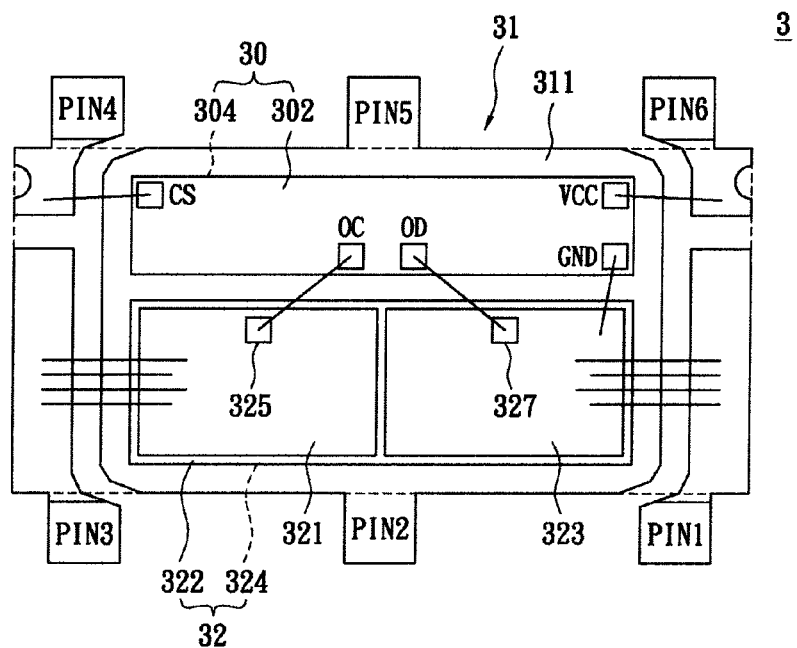
FIG. 7B is a schematic package structure diagram of another exemplary embodiment of the multi-chip module according to the present disclosure.

Furthermore, a bottom surface 304 of the battery protection chip 30 is disposed at the chip placement region 311 in an electrically isolated manner. The over-charging control output shim (OC) and the over-discharging control output shim (OD) at the top surface 302 of battery protection chip 30 are electrically connected to the first gate region 325 and the second gate region 327 at the top surface 322 of the electric power switch chip 32, respectively. The current sensing shim (CS) and the operation voltage input shim (VCC) setting at the top surface 302 of the battery protection chip 30 are electrically connected to the fourth pin PIN4 and sixth pin PIN6 of the pin frame 31, respectively. In addition, the ground shim (GND) of the top surface 302 of the battery protection chip 30 is directly and electrically connected to the first pin PIN1 of the pin frame 31. In another implementation, the ground shim (GND) may be electrically connected to the first pin PIN1 through the second source region 323 at the top surface 322 of the electric power switch chip 32 (as shown in FIG. 7B).

Figure 8A:
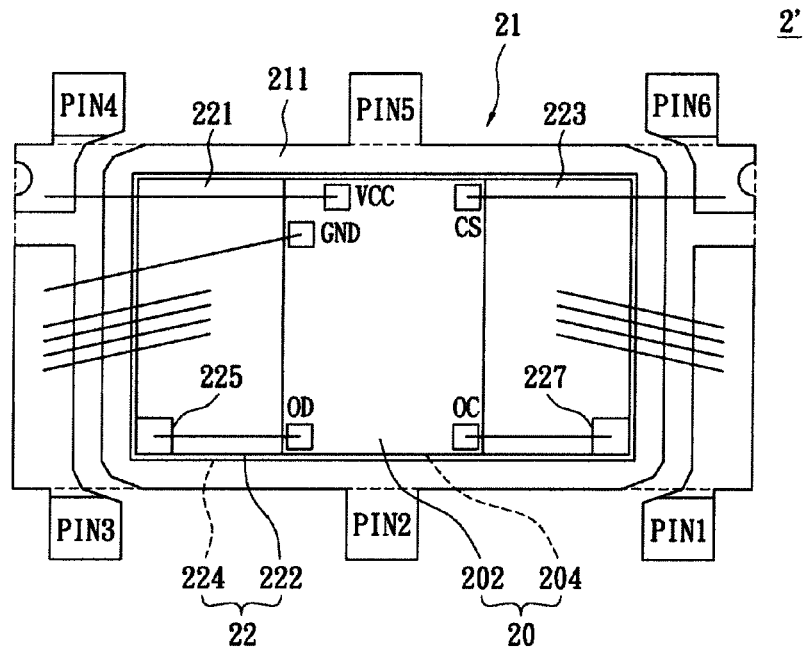
FIG. 8A is a schematic package structure diagram of another exemplary embodiment of the multi-chip module according to the present disclosure.

Please refer to FIG. 8A along with FIG. 6A. FIG. 8A is a schematic package structure diagram of an exemplary embodiment of another multi-chip module 2' according to the present disclosure. The difference between the multi-chip module 2' in FIG. 8A and the multi-chip module FIG. 6A includes that the locations of shims of multi-chip module 2' mirror the locations of shims of multi-chip module 2.

Figure 8B:
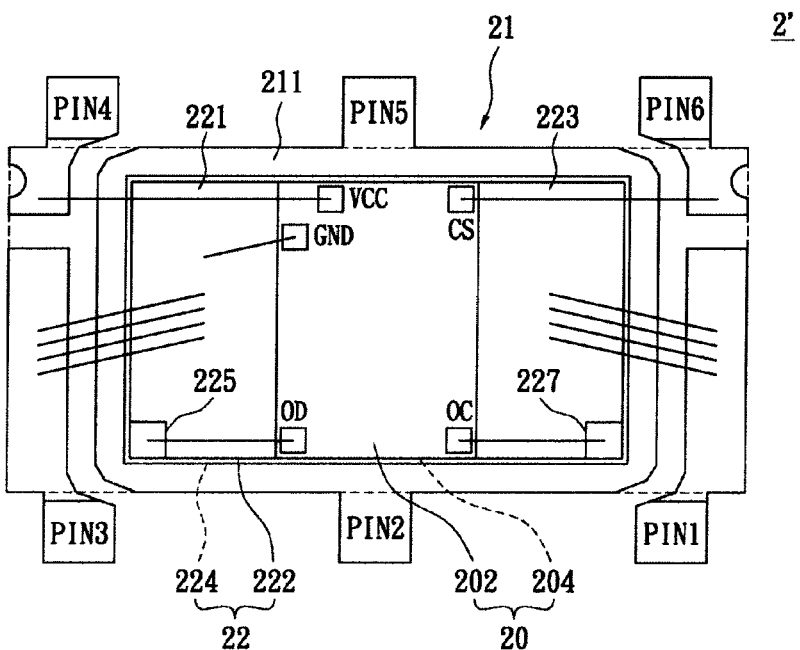
FIG. 8B is a schematic package structure diagram of another exemplary embodiment of the multi-chip module according to the present disclosure.

As shown in FIG. 8A, the over-charging control output shim (OC) of the battery protection chip 20 is electrically connected to the second gate region 227 of the electric power switch chip 22 via a conductive wire. The over-discharging control output shim (OD) is electrically connected to the first gate region 225 of the electric power switch chip 22 through another conductive wire. The operation voltage input shim (VCC) is electrically connected to the fourth pin PIN4 of the pin frame 21 through another conductive wire. The current sensing shim (CS) is electrically connected to the sixth pin PIN6 of the pin frame 21 via another conductive wire. In addition, the ground shim (GND) may be directly and electrically connected to the third pin PIN3 of the pin frame 21. Alternatively, the ground shim (GND) may be electrically connected to the third pin PIN3 through the first source region 221 of the electric power switch chip 22 (as shown in FIG. 8B). The pin location configurations of the multi-chip module 2' in FIGS. 8A and 8B may be the same as shown in FIG. 2B.

Figure 9A:
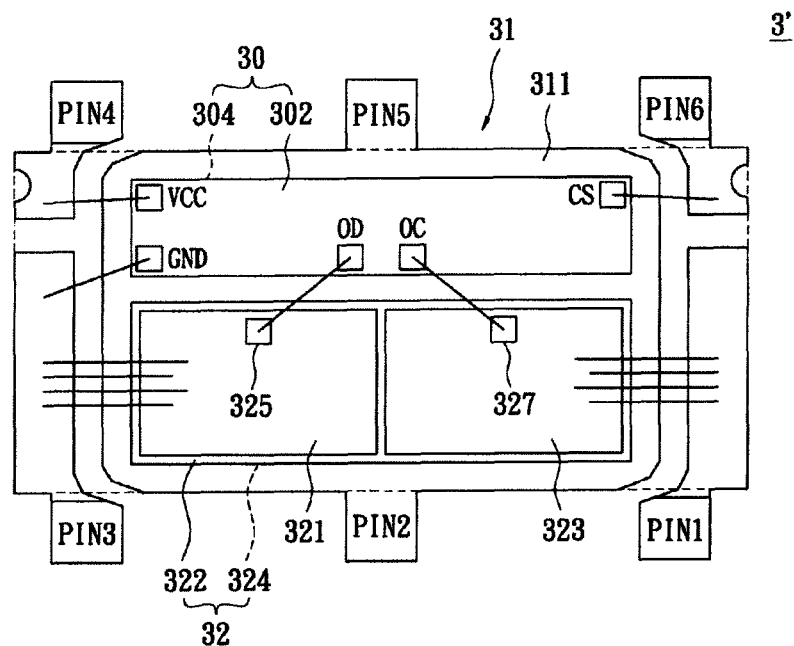
FIG. 9A is a schematic package structure diagram of another exemplary embodiment of the multi-chip module according to the present disclosure.

Please refer to FIG. 9A along with FIG. 7A. FIG. 9A is a schematic package structure diagram of an exemplary embodiment of another multi-chip module 3' according to the present disclosure. The difference between the multi-chip module 3' in FIG. 9A and the multi-chip module 3 in FIG. 7A includes that the shim locations of multi-chip module 3' mirror the shim locations of multi-chip module 3.

Figure 9B:
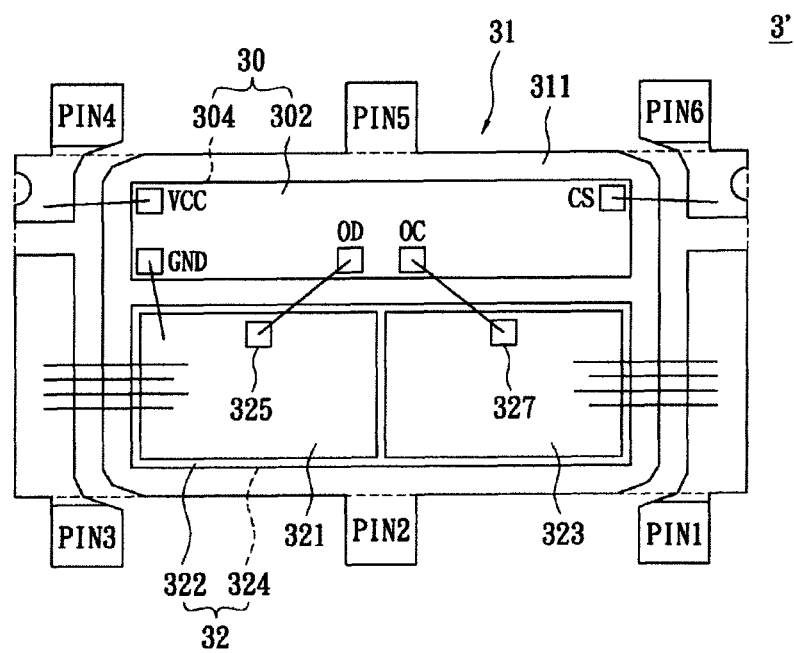
FIG. 9B is a schematic package structure diagram of another exemplary embodiment of the multi-chip module according to the present disclosure.

As shown in FIG. 9A, the over-charging control output shim (OC) of the battery protection chip 30 is electrically connected to the second gate region 327 of the electric power switch chip 32. The over-discharging control output shim (OD) is electrically connected to the first gate region 325 of the electric power switch chip 32. The current sensing shim (CS) of the battery protection chip 30 is electrically connected to the sixth pin PIN6 of the pin frame 31. The operation voltage input shim (VCC) is electrically connected to the fourth pin PIN4 of the pin frame 31. In addition, the ground shim (GND) of the battery protection chip 30 is directly and electrically connected to the third pin PIN3 of the pin frame 31. Alternatively, the ground shim (GND) is electrically connected to the third pin PIN3 through the first source region 321 of the electric power switch chip 32 (as shown in FIG. 9B). It is worth noting that the locations of the pins of the multi-chip module 3' in the FIGS. 9A and 9B may be the same as those of the embodiment of the present disclosure shown in FIG. 2B.

As previously mentioned, the multi-chip module according to the present disclosure is a single-cell lithium-ion/polymer battery protection IC which is embedded with the MOSFET and packaged by SOT 26. More specifically, the multi-chip module may occupy a space of 2.95 mm/1.56 mm/1.11 mm. Therefore, the multi-chip module according to the present disclosure may be associated with a reduce usage of the space when packaged by SOT 26.

Some modifications of these examples, as well as other possibilities will, on reading or having read this description, or having comprehended these examples, will occur to those skilled in the art. Such modifications and variations are comprehended within this disclosure as described here and claimed below. The description above illustrates only a relative few specific embodiments and examples of the disclosure. The disclosure, indeed, does include various modifications and variations made to the structures and operations described herein, which still fall within the scope of the disclosure as defined in the following claims.

What is claimed is:

1. A multi-chip module, comprising:
   a pin frame including a chip placement region, a first pin, a second pin, a third pin, a fourth pin, a fifth pin, and a sixth pin, wherein the second pin and the fifth pin are electrically connected to the chip placement region, and the first pin, the third pin, the fourth pin, and the sixth pin are electrically isolated from each other;
   an electric power switch chip including a top surface and a bottom surface, wherein the bottom surface of the electric power switch chip is electrically connected at the chip placement region, and the top surface of the electric power switch chip is electrically connected to the first pin and the third pin; and
   a battery protection chip including a top surface and a bottom surface, wherein the bottom surface of the battery protection chip is disposed at a predetermined area of the top surface of the electric power switch chip in an electrically isolated manner, and the top surface of the batter protection chip is electrically connected to the top surface of the electric power switch chip, the first pin, the fourth pin, and the sixth pin.

2. The multi-chip module as in claim 1, wherein the electric power switch chip includes two power metal-oxide-semiconductor field-effect transistors (power MOSFET), the bottom surface of the electric power switch chip is a common drain of the two power MOSFETs, and the top surface of the electric power switch chip has a first gate region, a second gate region, a first source region, and a second source region, wherein the first source region is electrically connected to the third pin, and the second source region is electrically connected to the first pin.

3. The multi-chip module as in claim 2, wherein the top surface of the battery protection chip has an over-charging control output shim, an over-discharging control output shim, an operation voltage input shim, a ground shim, and a current sensing shim.

4. The multi-chip module as in claim 3, wherein the over-charging control output shim is electrically connected to the first gate region, the over-discharging control output shim is electrically connected to the second gate region, the operation voltage input shim is electrically connected to the sixth pin, the current sensing shim is electrically connected to the fourth pin, and the ground shim is electrically connected to the first pin directly or is electrically connected to the first pin through the second source region.

5. The multi-chip module as in claim 4, wherein the first pin is a common ground pin, the second pin is a common drain pin, the third pin is a load pin, the fourth pin is an over current sensing pin, the fifth pin is the common drain pin, and the sixth pin is a battery voltage detection pin.

6. The multi-chip module as in claim 1, wherein the multi-chip module is packaged by small outline transistor 26 (SOT 26).

7. A multi-chip module, comprising:
   a pin frame including a chip placement region, a first pin, a second pin, a third pin, a fourth pin, a fifth pin, and a sixth pin, wherein the second pin and the fifth pin are electrically connected to the chip placement region, and the first pin, the third pin, the fourth pin, and the sixth pin are electrically isolated from each other;
   an electric power switch chip including a top surface and a bottom surface, wherein the bottom surface thereof is electrically connected at the chip placement region, and the top surface thereof is electrically connected to the first pin and the third pin; and
   a battery protection chip including a top surface and a bottom surface, wherein the bottom surface of the battery protection chip is disposed at the chip placement region in an electrically isolated manner, and the top surface of the battery protection chip is electrically connected to the top surface of the electric power switch chip, the first pin, the fourth pin, and the sixth pin.

8. The multi-chip module as in claim 7, wherein the electric power switch chip includes two power metal-oxide-semiconductor field-effect transistors (power MOSFET), and the bottom surface of the electric power switch chip is a common drain of the two power MOSFETs, the top surface of the electric power switch chip has a first gate region, a second gate region, a first source region, and a second source region, wherein the first source region is electrically connected to the third pin, and the second source region is electrically connected to the first pin.

9. The multi-chip module as in claim 8, wherein the top surface of the battery protection chip has an over-charging control output shim, an over-discharging control output shim, an operation voltage input shim, a ground shim, and a current sensing shim.

10. The multi-chip module as in claim 9, wherein the over-charging control output shim is electrically connected to the first gate region, the over-discharging control output shim is electrically connected to the second gate region, the operation voltage input shim is electrically connected to the sixth pin, the current sensing shim is electrically connected to the fourth pin, and the ground shim is electrically connected to the first pin directly or is electrically connected to the first pin through the second source region.

11. The multi-chip module as in claim 10, wherein the first pin is a common ground pin, the second pin is a common drain pin, the third pin is a load pin, the fourth pin is an over current sensing pin, the fifth pin is the common drain pin, and the sixth pin is a battery voltage detection pin.

12. The multi-chip module as in claim 7, wherein the multi-chip module is packaged by small outline transistor 26 (SOT 26).

* * * * *